United States Patent
Ye et al.

(10) Patent No.: US 8,344,715 B2
(45) Date of Patent: *Jan. 1, 2013

(54) SYSTEM AND METHOD FOR ADAPTIVE SWITCHING FREQUENCY CONTROL

(75) Inventors: Jun Ye, Shanghai (CN); Zhen Zhu, Shanghai (CN); Shifeng Zhao, Shanghai (CN); Lieyi Fang, Shanghai (CN); Zhiliang Chen, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/850,537

(22) Filed: Aug. 4, 2010

(65) Prior Publication Data

US 2011/0204865 A1 Aug. 25, 2011

Related U.S. Application Data

(63) Continuation of application No. 11/102,574, filed on Apr. 7, 2005, now Pat. No. 7,795,851.

(30) Foreign Application Priority Data

Mar. 11, 2005 (CN) .......................... 2005 1 0024385

(51) Int. Cl.
*G05F 1/575* (2006.01)
(52) U.S. Cl. ..................................................... 323/282
(58) Field of Classification Search .................. 323/282, 323/284, 285, 288, 351
See application file for complete search history.

(56) References Cited

U.S. PATENT DOCUMENTS

| | | | |
|---|---|---|---|
| 6,229,366 B1 | 5/2001 | Balakirshnan et al. | |
| 6,249,876 B1 | 6/2001 | Balakrishnan et al. | |
| 6,545,882 B2 | 4/2003 | Yang | |
| 7,057,380 B2 | 6/2006 | Kuo et al. | |
| 7,075,277 B2 | 7/2006 | Ishii et al. | |
| 7,466,112 B2 * | 12/2008 | Zhou et al. | 323/259 |

FOREIGN PATENT DOCUMENTS

CN 1200504 C 5/2005
CN 100413190 C 8/2008

* cited by examiner

*Primary Examiner* — Gary L Laxton
(74) *Attorney, Agent, or Firm* — Jones Day (57) ABSTRACT

System and method for providing frequency control to a power converter. The system includes a controller configured to receive a load signal and generate a first control signal. The load signal indicates an output load for a power converter. Additionally, the system includes a signal generator configured to receive the first control signal and generates at least a first output signal. The first output signal is associated with a first signal strength and a first frequency. The first frequency is inversely proportional to a sum of a first time period, a second time period, and a third time period. The first signal strength increases with the time during the first time period, the first signal strength decreases with the time during the second time period, and the first signal strength is constant with respect to the time during the third time period.

35 Claims, 9 Drawing Sheets

FIG. 1

(Prior Art)

SYSTEM AND METHOD FOR ADAPTIVE SWITCHING FREQUENCY CONTROL

CROSS-REFERENCES TO RELATED APPLICATIONS

This application is a continuation of U.S. patent application No. 11/102,574, filed Apr. 7, 2005, which claims priority to Chinese Patent Application No. 200510024385.6 (EastIP Ref No. 05N12016-1365-SMY), filed Mar. 11, 2005, entitled "System and Method for Adaptive Switching Frequency Control," by Inventors Jun Ye, Zhen Zhu, Shifeng Zhao, Lieyi Fang, and Zhiliang Chen, commonly assigned, both applications being incorporated by reference herein for all purposes.

The following two commonly-owned co-pending applications, including this one, are being filed concurrently and the other one is hereby incorporated by reference in its entirety for all purposes:

1. U.S. patent application Ser. No. 11/102,574, in the name of Jun Ye, Zhen Zhu, Shifeng Zhao, Lieyi Fang, and Zhiliang Chen, titled, "System and Method for Adaptive Switching Frequency Control," and 2. U.S. patent application Ser. No. 11/102,611, in the name of Jun Ye, Zhen Zhu, Shifeng Zhao, Lieyi Fang, and Zhiliang Chen, titled, "System and Method for Controlling Variations of Switching Frequency,".

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits. More particularly, the invention provides a system and method for frequency control. Merely by way of example, the invention has been applied to a power converter. But it would be recognized that the invention has a much broader range of applicability.

Power converters are widely used for consumer electronics such as portable devices. The power converters can convert electric power from one form to another form. As an example, the electric power is transformed from alternate current (AC) to direct current (DC), from DC to AC, from AC to AC, or from DC to DC. Additionally, the power converters can convert the electric power from one voltage level to another voltage level. The power converters include linear converters and switch-mode converters.

Figure 1:
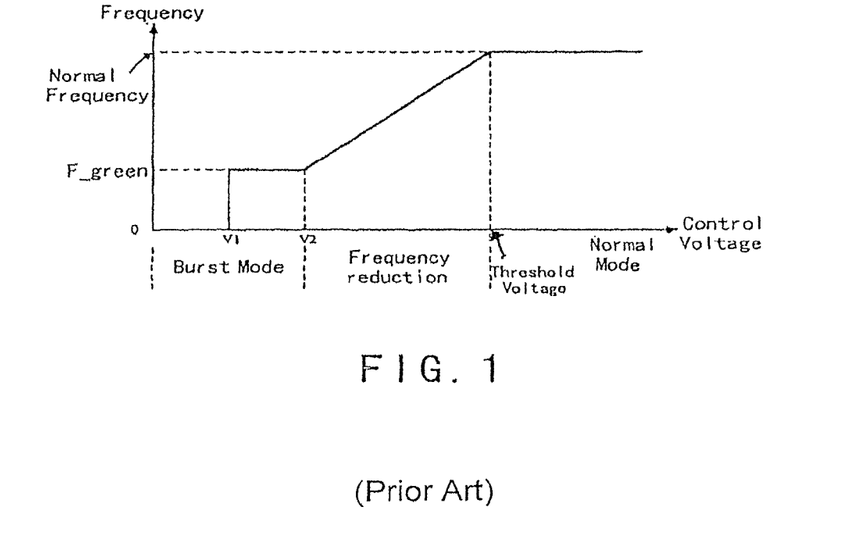
FIG. 1 is a conventional diagram for switching frequency control.

The switch-mode converters can consume significant power under standby conditions. For example, the standby conditions correspond to light or zero output loads. The standby power includes energy losses at various components of the switch-mode converters such as power switches, transformers, inductors, and snubbers. These losses often increase with the switching frequency. To reduce the standby power, the switching frequency is usually lowered for light or zero output loads. FIG. 1 is a conventional diagram for switching frequency control. When the control voltage is lower than a threshold voltage, the switching frequency is smaller than the normal frequency. The control voltage increases with the output load.

Some conventional switch-mode converters use an oscillator to generate a switching frequency. The switching frequency is modulated based on the magnitude of an output load. For example, the oscillator includes a ramping waveform generator or an RC oscillator if the normal frequency is in the range of tens of kHz. The rising time is controlled by a current source to charge a capacitor, and the falling time is controlled by a current sink to discharge the capacitor. By controlling the charge and/or discharge current of the capacitor, the switching frequency is modulated. But this conventional technique often cannot provide sufficient stability to the switch-mode converters.

Hence it is highly desirable to improve techniques for switching frequency control.

BRIEF SUMMARY OF THE INVENTION

The present invention is directed to integrated circuits. More particularly, the invention provides a system and method for frequency control. Merely by way of example, the invention has been applied to a power converter. But it would be recognized that the invention has a much broader range of applicability.

According to one embodiment of the present invention, a system for providing frequency control to a power converter is provided. The system includes a controller configured to receive a load signal and generate a first control signal. The load signal indicates an output load for a power converter. Additionally, the system includes a signal generator configured to receive the first control signal and generates at least a first output signal. The first output signal is associated with a first signal strength and a first frequency. The first frequency is inversely proportional to a sum of a first time period, a second time period, and a third time period. The first signal strength increases with the time during the first time period, the first signal strength decreases with the time during the second time period, and the first signal strength is constant with respect to the time during the third time period. The third time period varies with the load signal if the load signal is within a predetermined range.

According to another embodiment, a system for providing frequency control to a power converter includes a first controller configured to receive a load signal and generate a first control signal. The load signal indicates an output load for a power converter. Additionally, the system includes a compensation system configured to receive an input signal for the power converter and generate a second control signal, and a signal generator configured to receive the first control signal and the second control signal and generates at least an output signal. The output signal is associated with a signal strength and a frequency. The frequency is inversely proportional to a sum of a first time period, a second time period, and a third time period. The signal strength increases with the time at a first slope during the first time period, the signal strength decreases with the time at a second slope during the second time period, and the signal strength is constant with respect to the time during the third time period. The first slope varies with the input signal within a signal range, and the second slope varies with the input signal within the signal range.

According to yet another embodiment, a method for providing frequency control to a power converter includes receiving a load signal. The load signal indicates an output load for a power converter. Additionally, the method includes generating a control signal in response to the load signal, processing information associated with the control signal, and generating an output signal based on at least information associated with the control signal. The output signal is associated with a signal strength and a frequency. The frequency is inversely proportional to a sum of a first time period, a second time period, and a third time period. The signal strength increase with the time during the first time period, the signal strength decrease with the time during the second time period, and the signal strength is constant with respect to the time during the third time period. The third time period varies with the load signal if the load signal is within a predetermined range.

According to yet another embodiment, a method for providing frequency control to a power converter includes receiving a load signal. The load signal indicates an output load for a power converter. Additionally, the method includes generating a first control signal in response to the load signal, receiving an input signal for the power converter, generating a second control signal in response to the input signal, processing information associated with the first control signal and the second control signal, and generating an output signal based on at least information associated with the first control signal and the second control signal. The output signal is associated with a signal strength and a frequency. The frequency is inversely proportional to a sum of a first time period, a second time period, and a third time period. The signal strength increases with the time at a first slope during the first time period, the signal strength decreases with the time at a second slope during the second time period, and the signal strength is constant with respect to the time during the third time period. The first slope varies with the input signal within a signal range, and the second slope varies with the input signal within the signal range.

Many benefits are achieved by way of the present invention over conventional techniques. For example, some embodiments of the present invention provide an adaptive signal generator. The signal frequency is controlled by at least a control signal generated by a frequency variation generator and another control signal that represents the output loading. For example, the frequency variation generator outputs a randomized signal. In another example, the control signal for output loading includes a feedback voltage. Certain embodiments of the present invention provide an efficient control over switching frequency with low standby power. Some embodiments of the present invention improve stability of the power converter.

Certain embodiments of the present invention use dead-time modulation for adaptive frequency control. Some embodiments of the present invention provide an output waveform that includes three phases. In one embodiment, the three phases include a charging phase, a discharging phase, and a dead-time phase. For example, a dead-time phase is inserted between a discharging phase and a charging phase. In anther embodiment, the oscillator output frequency is adjusted by modulating the dead-time phase in response to various load conditions. For example, the dead-time phase is modulated by a voltage representing the output load for a switch-mode power converter. In yet another embodiment, the time period for the charging phase and the time period for the discharging phase are both independent of the load conditions. In yet another embodiment, the slope for signal strength during the charging phase and the discharging phase is independent of the load conditions. For example, the slope depends on the input voltage of the switch-mode power converter, but not the output load of the switch-mode power converter. Certain embodiments of the present invention provide dead-time modulation by charging a capacitor from an initial voltage level to a threshold voltage level with a constant current source. Some embodiments of the present invention provide a dead-time phase whose time period increases with the output load under light load or no load conditions. Some embodiments of the present invention provide a dead-time phase whose time period equal to zero under normal and heavy load conditions.

Certain embodiments of the present invention provide a signal generator. The signal slope is compensated for variations in input voltage, and used for slop compensation in a switch-mode power converter. For example, the power converter operates in the current mode. Some embodiments of the present invention sense the input voltage and adjust at least the charging and discharging currents accordingly. Certain embodiments of the present invention provide a ramping signal used for slope compensation. The ratio of slope compensation remains constant with respect to the input voltage. Some embodiments of the present invention improve stability of current feedback loop. Certain embodiments of the present invention use a clock randomizer for frequency modulation.

Various additional objects, features and advantages of the present invention can be more fully appreciated with reference to the detailed description and the accompanying drawings that follow.

DETAILED DESCRIPTION OF THE INVENTION

The present invention is directed to integrated circuits. More particularly, the invention provides a system and method for frequency control. Merely by way of example, the invention has been applied to a power converter. But it would be recognized that the invention has a much broader range of applicability.

Figure 2:
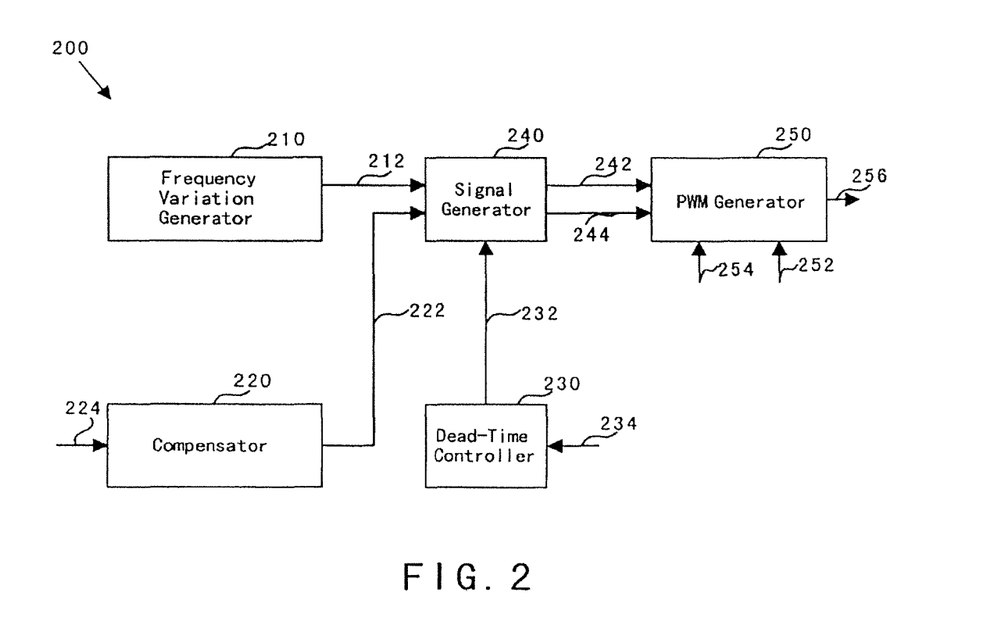
FIG. 2 is a simplified system for frequency control according to an embodiment of the present invention.

FIG. 2 is a simplified system for frequency control according to an embodiment of the present invention. This diagram is merely an example, which should not unduly limit the scope of the claims. One of ordinary skill in the art would recognize many variations, alternatives, and modifications. A system 200 includes a frequency variation generator 210, a compensator 220, a dead-time controller 230, a signal generator 240, and a pulse-width-modulation (PWM) generator 250. Although the above has been shown using a selected group of components for the system 200, there can be many alternatives, modifications, and variations. For example, some of the components may be expanded and/or combined. Other components may be inserted to those noted above. Depending upon the embodiment, the arrangement of components may be interchanged with others replaced. For example, the PWM generator 250 is replaced by another component receiving at least an output signal of the signal generator 240. In another example, the compensator 220 is a compensation system. Further details of these components are found throughout the present specification and more particularly below.

The signal generator 240 receives control signals 212, 222, and 232 from the frequency variation generator 210, the compensator 220, and the dead-time controller 230 respectively. In response, the signal generator 240 outputs a clock signal 242 and a ramping signal 244 to the PWM generator 250. In one embodiment, the PWM generator 250 also receives a voltage feedback signal 252 and a current sensing signal 254, and generates a PWM signal 256. For example, the PWM signal 256 is used to turn on or off a power switch in a switch-mode power converter. In one embodiment, the switch-mode power converter is an off-line power converter. In another example, the ramping signal 244 is used for slop compensation in the switch-mode power converter. In one embodiment, the power converter operates in a current mode. In another embodiment, the signal generator includes an oscillator.

The dead-time controller 230 receives a load signal 234 and generates the control signal 232. The load signal 234 represents the level of output load for the switch-mode converter. For example, the load signal 234 includes a control voltage which increases with the output load. As another example, the load signal 234 is generated by a feedback loop. In response to the load signal 234, the dead-time controller 230 outputs the control signal 232 to the signal generator 240. The signal generator 240 uses the control signal 232 to perform frequency control.

Figure 3:
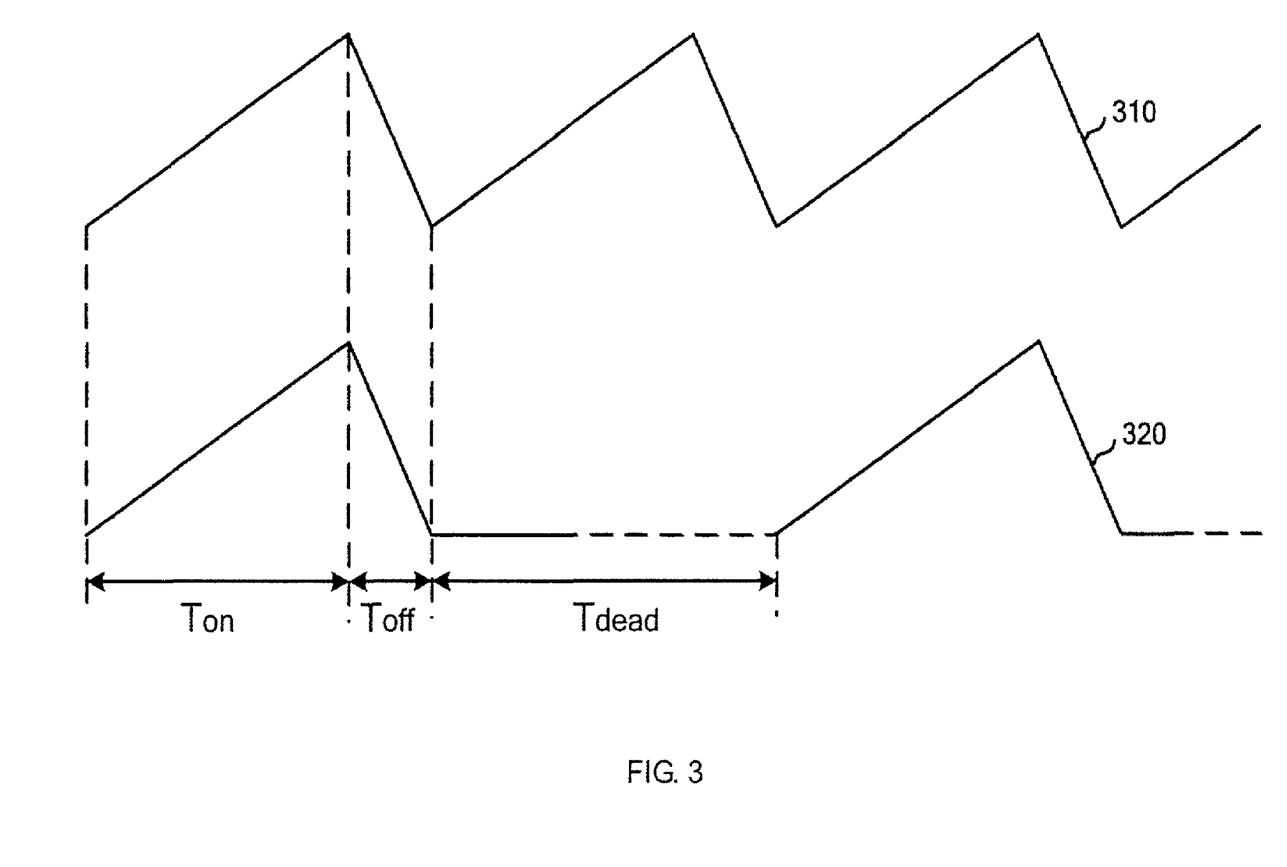
FIG. 3 is a simplified diagram for frequency control with dead-time modulation according to an embodiment of the present invention.

FIG. 3 is a simplified diagram for frequency control with dead-time modulation according to an embodiment of the present invention. This diagram is merely an example, which should not unduly limit the scope of the claims. One of ordinary skill in the art would recognize many variations, alternatives, and modifications. As shown in FIG. 3, curves 310 and 320 represent the ramping signal 244 generated by the signal generator 240. Each curve has a vertical axis representing signal strength and a horizontal axis representing time. For example, the vertical axis indicates voltage level or current level. The curve 310 is the ramping signal 244 without any dead-time modulation. Each period includes a charging time $T_{on}$ and a discharging time $T_{off}$. The curve 320 is the ramping signal 244 with dead-time modulation. For example, A dead-time phase is inserted to successive discharging and charging phases. Each period includes a charging time $T_{on}$, a discharging time $T_{off}$, and a dead time $T_{dead}$. During $T_{dead}$, the signal strength remains constant with time. If $T_{dead}$ equals zero, the curve 320 becomes the same as the curve 310.

In one embodiment, $T_{dead}$ is modulated by the load signal 234 through the dead-time controller 230. For example, under light or no load conditions, a long $T_{dead}$ is generated. In another example, under normal and heavy load condition, a $T_{dead}$ substantially equal to zero is generated. In another embodiment, the frequency of the ramping signal 244 is controlled by the output load of the switch-mode converter.

The compensator 220 receives an input voltage 224 and generates the control signal 222. The control signal 222 is received by the signal generator 240. For example, the signal generator 240 includes an oscillator. In another example, the signal generator outputs the ramping signal whose slope of signal strength as a function of time is adjusted based on the control signal 222.

Figure 4:
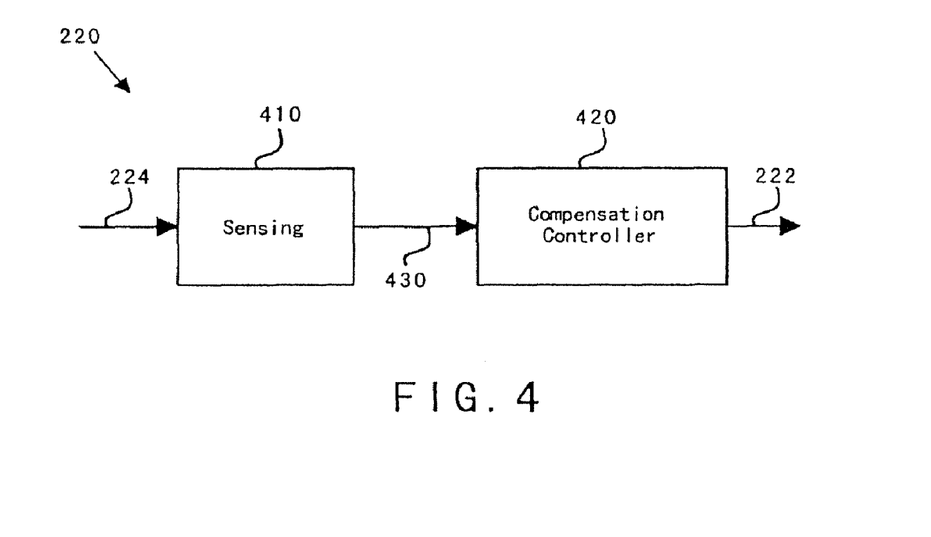
FIG. 4 is a simplified compensator according to an embodiment of the present invention.

FIG. 4 is a simplified compensator according to an embodiment of the present invention. This diagram is merely an example, which should not unduly limit the scope of the claims. One of ordinary skill in the art would recognize many variations, alternatives, and modifications. The compensator 220 includes a sensing system 410 and a compensation controller 420. The sensing system 410 receives the input voltage 224 and generates a control signal 430. The control signal 430 represents the magnitude of the input voltage 224.

In one embodiment, the control signal 430 is in the current domain. In another embodiment, the control signal 430 is in the voltage domain. The control signal 430 is received by the compensation controller 420, which generates the control signal 222 in response.

Figure 5:
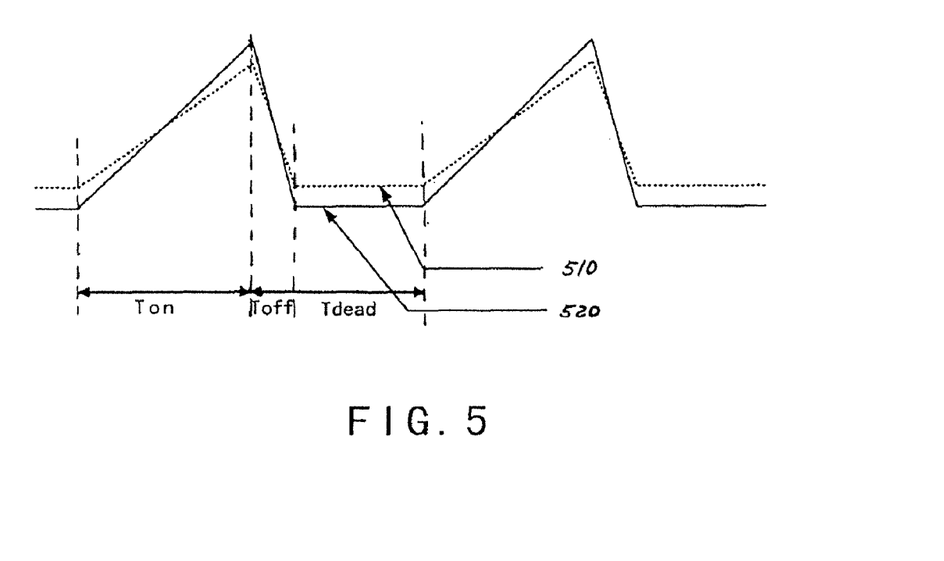
FIG. 5 is a simplified diagram for slope control according to an embodiment of the present invention.

As discussed above, the control signal 222 is received by the signal generator 240. For example, the signal generator 240 includes an oscillator. In another example, the signal generator 240 outputs the ramping signal 244 whose slope of signal strength as a function of time is adjusted based on the control signal 222. FIG. 5 is a simplified diagram for slope control according to an embodiment of the present invention. This diagram is merely an example, which should not unduly limit the scope of the claims. One of ordinary skill in the art would recognize many variations, alternatives, and modifications. As shown in FIG. 5, curves 510 and 520 represent the ramping signal 244 generated by the signal generator 240. Each curve has a vertical axis representing signal strength and a horizontal axis representing time. For example, the vertical axis indicates voltage level or current level. The curves 510 and 520 has the same frequency. Each period includes a charging time $T_{on}$, a discharging time $T_{off}$, and a dead time $T_{dead}$. During $T_{on}$ and $T_{off}$, the slope of the curve 510 has a magnitude smaller than that of the curve 520. During $T_{dead}$, the slopes of the curves 510 and 520 are the same and equal to zero. In one embodiment, the curve 510 corresponds to a voltage level $V_1$ for the input voltage 224, and the curve 520 corresponds to a voltage level $V_2$ for the input voltage 224. For example, $V_1$ is larger than $V_2$. In another embodiment, slope of the ramping signal 244 vary with the input voltage 224 during charging and discharging periods. The slope is used by the switch-mode power converter to provide slope compensation to the feedback loop. For example, the slope compensation ratio is constant regardless of the input voltage 224. In another example, the power converter operates in the current mode.

Additionally, as shown in FIG. 2, the signal generator 240 outputs the clock signal 242. For example, the clock signal 242 has the same frequency as the ramping signal 244. In another example, the clock signal 242 is used by the PWM generator 250 to control switching frequency of the switch-mode power converter.

Figure 6:
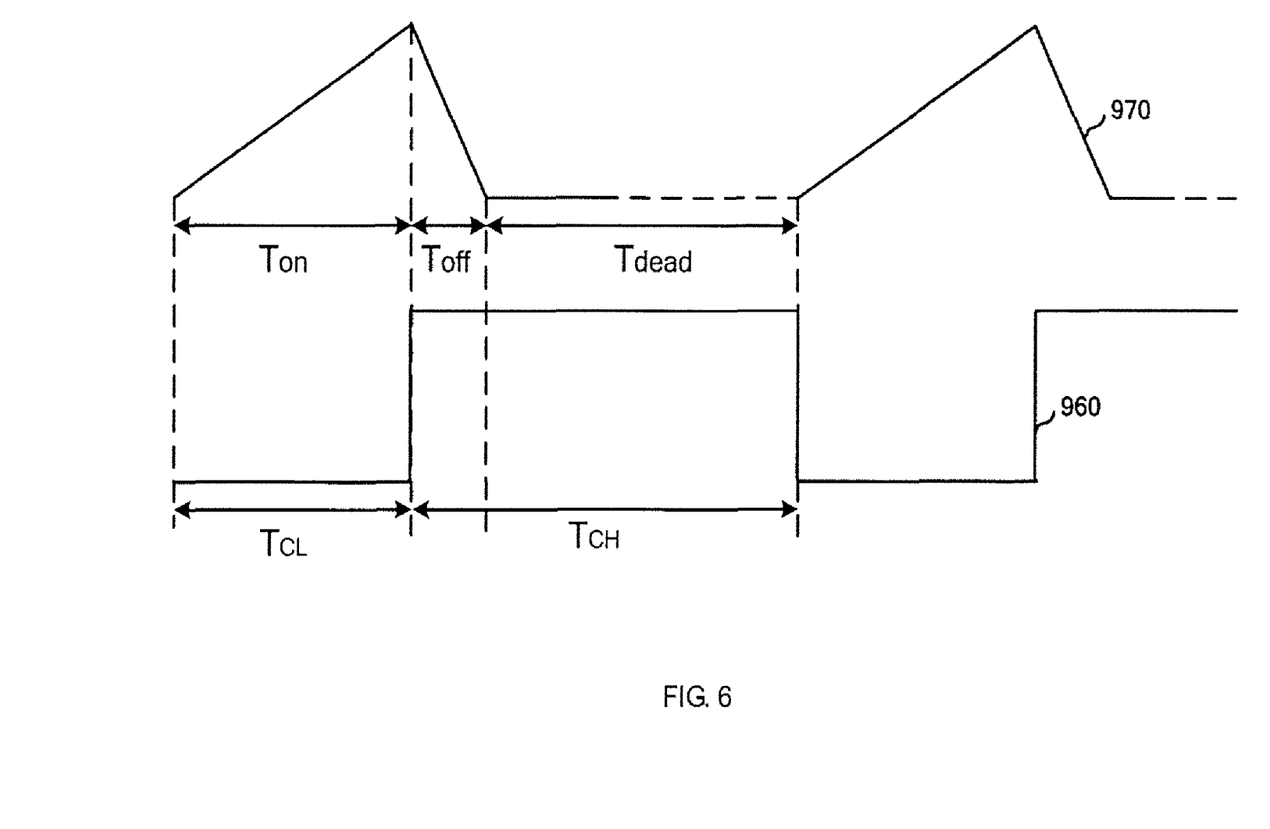
FIG. 6 is a simplified diagram for clock signal and ramping signal according to an embodiment of the present invention.

FIG. 6 is a simplified diagram for clock signal and ramping signal according to an embodiment of the present invention. This diagram is merely an example, which should not unduly limit the scope of the claims. One of ordinary skill in the art would recognize many variations, alternatives, and modifications. As shown in FIG. 6, curves 960 and 970 represent the clock signal 242 and the ramping signal 244 respectively. The curves 960 and 970 each have a vertical axis representing signal strength and a horizontal axis representing time. For example, the vertical axis indicates voltage level or current level. In one embodiment, the curve 970 is the same as the curve 320.

The curves 960 includes two phases $T_{CL}$ and $T_{CH}$ for each period. The phase $T_{CL}$ corresponds to a low clock signal strength, and the phase $T_{CL}$ corresponds to a clock high signal strength. The curves 970 includes three phases $T_{on}$, $T_{off}$, and $T_{dead}$. $T_{on}$ is equal to $T_{CL}$, and the sum of $T_{off}$ and $T_{dead}$ is equal to $T_{CH}$. The sum of $T_{CL}$ and $T_{CH}$ equals the sum of $T_{on}$, $T_{off}$, and $T_{dead}$. The curves 960 and 970 have the same frequency.

Figure 7:
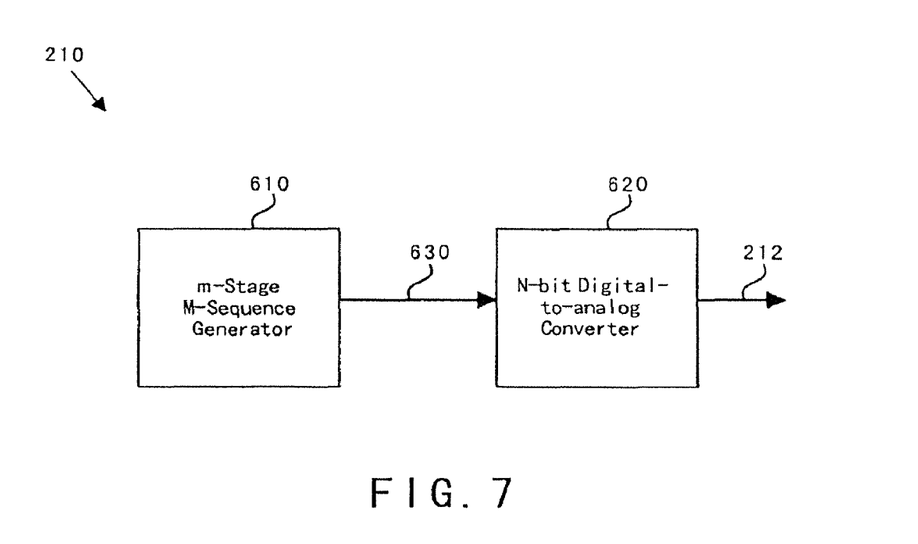
FIG. 7 is a simplified frequency variation generator according to an embodiment of the present invention.

Returning to FIG. 2, the frequency variation generator 210 generates the control signal 212. The control signal 212 is used by the signal generator 240 to provide a frequency spread to the signal generated by an oscillator of the signal generator 240. FIG. 7 is a simplified frequency variation generator according to an embodiment of the present invention. This diagram is merely an example, which should not unduly limit the scope of the claims. One of ordinary skill in the art would recognize many variations, alternatives, and modifications. The frequency variation generator 210 is a clock randomizer. The clock randomizer includes an m-stage M-sequence generator 610 and an N-bit digital-to-analog converter 620. The N-bit digital-to-analog converter 620 receives a signal 630 and generates the control signal 212. For example, the control signal 212 is a pseudo random signal. In another embodiment, the frequency variation generator 210 includes a system capable of providing frequency variations. See U.S. Pat. Nos. 6,229,366 and 6,249,876.

Figure 8:
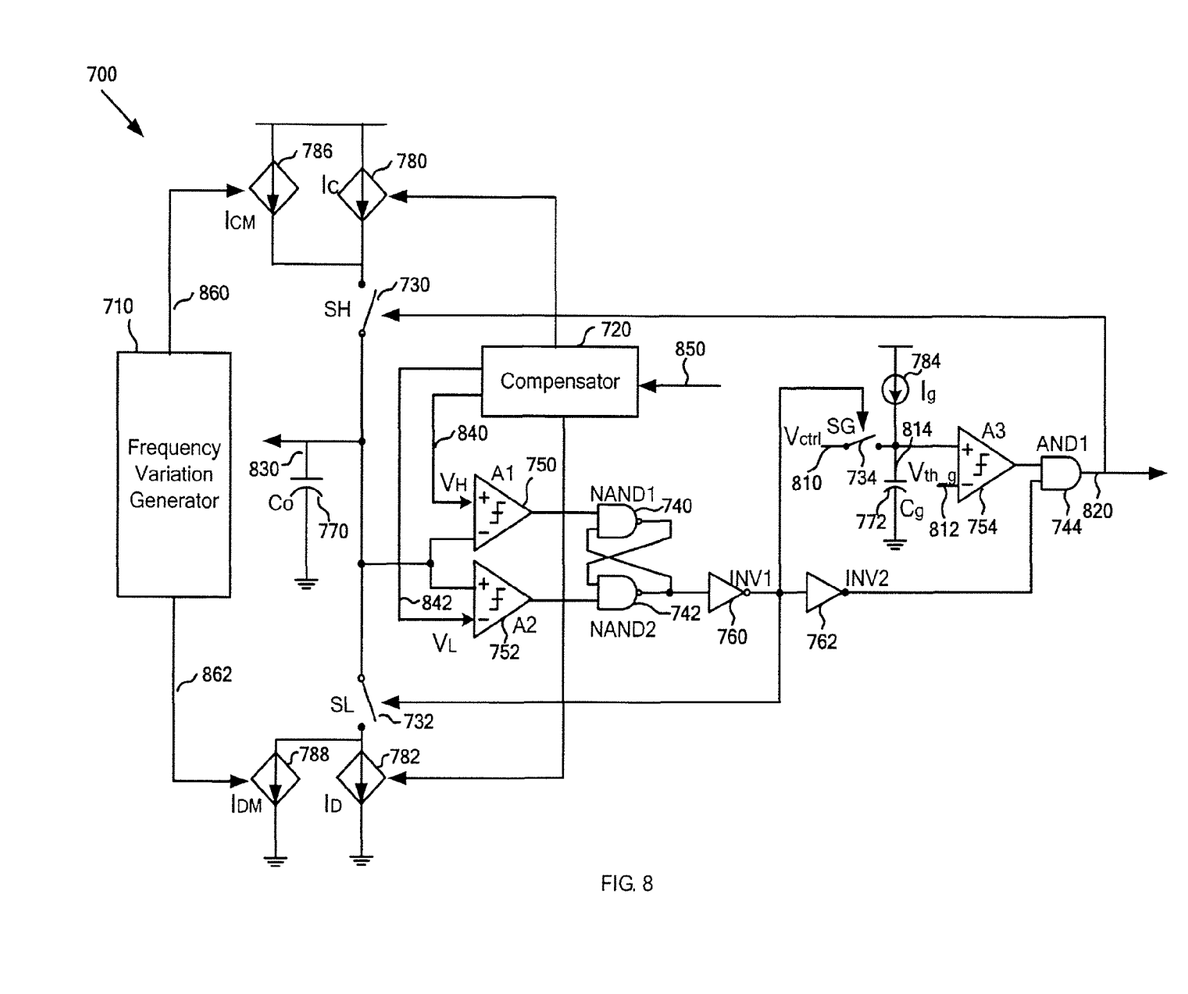
FIG. 8 is a simplified system for frequency control according to another embodiment of the present invention.

FIG. 8 is a simplified system for frequency control according to another embodiment of the present invention. This diagram is merely an example, which should not unduly limit the scope of the claims. One of ordinary skill in the art would recognize many variations, alternatives, and modifications. A system 700 includes a frequency variation generator 710, a compensator 720, switches 730, 732 and 734, NANDs 740 and 742, AND 744, comparators 750, 752 and 754, inverters 760 and 762, capacitors 770 and 772, current sources 780, 782, 784, 786 and 788. Although the above has been shown using a selected group of components for the system 700, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The capacitor 770 is charged or discharged through the switch 730 (SH) or the switch 732 (SL) respectively. Between the discharging phase ($T_{off}$) and the charging phase ($T_{on}$), a dead time $T_{dead}$ can be inserted between $T_{on}$ and $T_{off}$ by keeping both switches 730 and 732 open. The outputs of comparators 750 (A1) and 752 (A2) are latched by an RS flip-flop. The RS flip-flop includes the NANDs 740 (NAND1) and 742 (NAND2). The comparators 750 (A1) and 752 (A2) are voltage clamping comparators with threshold voltages 840 ($V_N$) and 842 ($V_L$) respectively. The voltage 830 at one terminal of the capacitor 770 has a voltage range that is equal to the difference between the threshold voltages 842 and 840.

The capacitor 772 ($C_g$), the current source 784 ($I_g$), the switch 734 (SG), and the comparator 754 (A3) are used for dead-time modulation. If a control voltage 810 ($I_{ctrl}$) is smaller than a threshold voltage ($V_{th\_g}$), a voltage 814 at one terminal of the capacitor 772 begins to rise from the control voltage 810 to the threshold voltage 812 after a discharging phase ($T_{off}$) ends for the capacitor 770 ($C_0$). For example, the rise of the voltage 814 is supported by the current source 784. At the end of the discharging period, the switch 734 becomes open.

When the voltage 814 reaches the threshold voltage 812, a signal 820 generated by the AND 744 (AND1) is used to close the switch 730 (SH). Subsequently, the voltage 830 for the capacitor 770 starts to rise, and the charging phase ($T_{on}$) begins. In one embodiment, the dead time $T_{dead}$ is the period when the switches 730 and 732 are both open. During the dead time, the voltage 830 is kept constant.

As shown in FIG. 8, the dead time $T_{dead}$ is proportional to the difference between the threshold voltage ($V_{th\_g}$) and the control voltage 810 ($V_{ctrl}$) if $V_{ctrl}$ is less than $V_{th\_g}$. For example, $T_{dead}$ increases with decreasing $V_{ctrl}$ if $V_{ctrl}$ is less than $V_{th\_g}$. The oscillation frequency of the voltage 830 decreases with decreasing $V_{ctrl}$. For example, the control voltage 810 ($V_{ctrl}$) represents the level of output load for the switch-mode converter. In another example, $V_{ctrl}$ increases with the output load. In yet another example, $V_{ctrl}$ is generated by a feedback loop. If $V_{ctrl}$ is greater than or equal to $V_{th\_g}$, the dead time $T_{dead}$ equals to zero.

In another embodiment, $V_{th\_g}$ corresponds a threshold output load, and $V_{ctrl}$ varies with the output load. For example, $V_{ctrl}$ increases with the output load. As shown in FIG. 8, $T_{dead}$ increases with the decreasing output load if the output load is less than the threshold output load. For example, $T_{dead}$ increases with the decreasing output load if the output load is less than the threshold output load but more than another threshold output load. If the output load is more than or equal to the threshold output load, the dead time $T_{dead}$ equals to zero.

In yet another embodiment, the charging time $T_{on}$ and the discharging time $T_{off}$ each are constant with respect to $V_{ctrl}$. For example, $V_{ctrl}$ varies with the output load. The charging time $T_{on}$ and the discharging time $T_{off}$ each are constant with respect to output load.

In yet another embodiment, time periods for charging phase, discharging phase, and dead time phase are determined as follows:

$$T_{on} = \frac{(V_H - V_L) \times C_O}{I_C + I_{CM}} \quad \text{(Equation 1)}$$

$$T_{off} = \frac{(V_H - V_L) \times C_O}{I_D + I_{DM}} \quad \text{(Equation 2)}$$

$$T_{dead} = \frac{(V_{th\_g} - V_{ctrl}) \times C_g}{I_g} \text{ if } V_{th\_g} > V_{ctrl} \quad \text{(Equation 3)}$$

$$T_{dead} = 0 \text{ if } V_{th\_g} \leq V_{ctrl} \quad \text{(Equation 4)}$$

where $T_{on}$, $T_{off}$, and $T_{dead}$ are time periods for charging phase, discharging phase, and dead-time phase respectively. $T_{on}$ depends on the sum of current sources 780 ($I_C$) and 786 ($I_{CM}$) and the difference between the threshold voltages 840 ($V_H$) and 842 ($V_L$). $T_{off}$ depends on the sum of current sources 782 ($I_D$) and 788 ($I_{DM}$). Additionally, the frequency $F_S$ of the voltage 830 is defined as follows:

$$F_S = \frac{1}{T_{on} + T_{off} + T_{dead}} \quad \text{(Equation 5)}$$

As shown in FIG. 8, the current sources 786 ($I_{CM}$) and 788 ($I_{DM}$) are modulated by control signals 1860 and 1862 from the frequency variation generator 710. In one embodiment, the frequency variation generator 710 includes the m-stage M-sequence generator 610 and the N-bit digital-to-analog converter 620 as shown in FIG. 7. In another embodiment, the frequency variation generator 710 includes a system capable of providing frequency variations. See U.S. Pat. Nos. 6,229,366 and 6,249,876.

Figure 9:
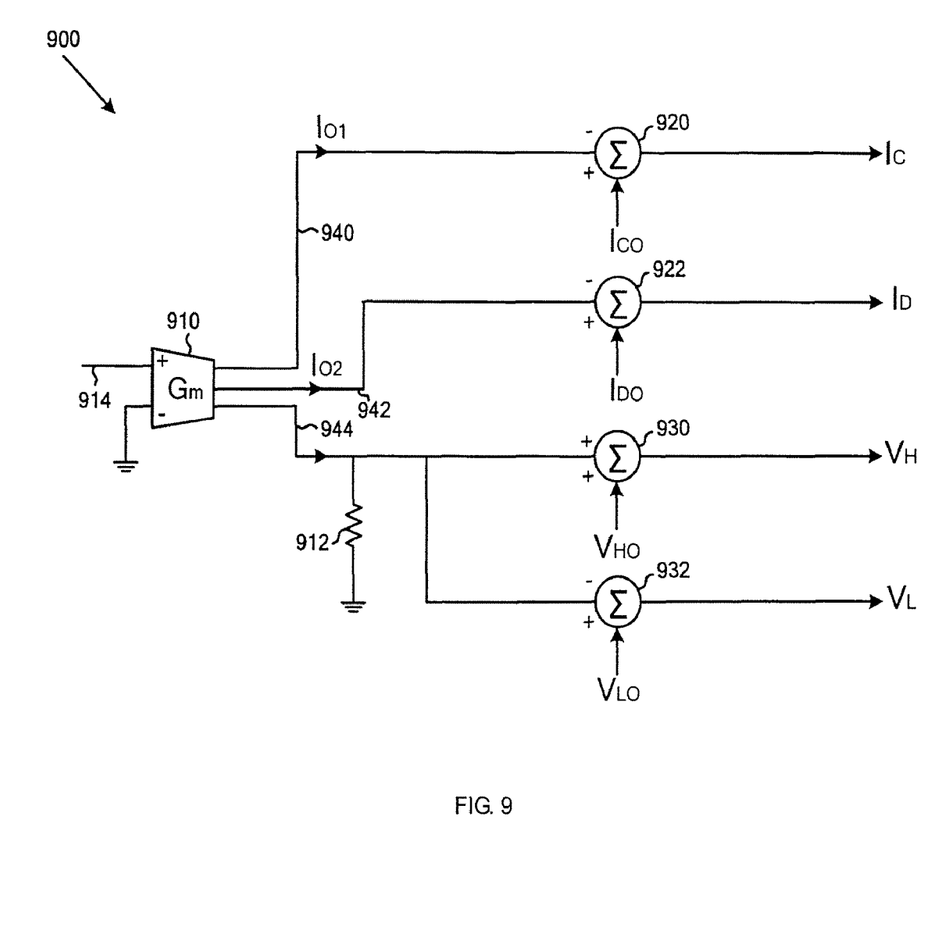
FIG. 9 is a simplified diagram for a compensator and current sources according to an embodiment of the present invention.

The current sources 780 ($I_C$) and 782 ($I_D$), and the threshold voltages 840 ($V_H$) and 842 ($V_L$) are modulated by the compensator 720. The compensator 720 receives an input voltage 850. FIG. 9 is a simplified diagram for a compensator and current sources according to an embodiment of the present invention. This diagram is merely an example, which should not unduly limit the scope of the claims. One of ordinary skill in the art would recognize many variations, alternatives, and modifications. The system 900 includes a transconductor 910, a resistor 912, current sources 920 and 922, and voltage sources 930 and 932. Although the above has been shown using a selected group of components for the system 900, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The transconductor 910 receives an input voltage 914 and generates currents 940 ($I_{O1}$) and 942 ($I_{O2}$). The currents 940 and 942 are received by the current sources 920 and 922 respectively, which output the currents $I_C$ and $I_D$ respectively. For example, $$I_C = I_{C0} - I_{O1} \quad \text{(Equation 6)}$$

$$I_D = I_{D0} - I_{O2} \quad \text{(Equation 7)}$$

$$\frac{I_{C0}}{I_{D0}} = \frac{I_{O1}}{I_{O2}} \quad \text{(Equation 8)}$$

In one embodiment,

Additionally, the transconductor 910 generates a voltage 944 ($V_O$) through the resistor 912 in response to the input voltage 914. The voltage 944 is received by the voltage sources 930 and 932, which output the voltages $V_H$ and $V_L$ respectively. For example, $$V_H = V_{H0} - V_O \quad \text{(Equation 9)}$$

$$V_L = V_{L0} - V_O \quad \text{(Equation 10)}$$

In one embodiment, the system 914 is used as the compensator 720 and the current sources 780 and 782. The currents $I_C$ and $I_D$ are used for charging and discharging of the capacitor 770 respectively. The voltages $V_H$ and $V_L$ are used as threshold voltages for comparators 750 and 752 respectively.

As shown in FIGS. 8 and 9, the voltage 830 increases with time at a slope during the charging phase ($T_{on}$), and decreases with time at another slope during the discharging phase ($T_{off}$). Both slopes vary with the input voltage 850. For example, the slopes vary with the input voltage 850 within a predetermined voltage range. In another example, the slopes are constant with respect to the control voltage 810 ($V_{ctrl}$), but vary with respect to the input voltage 850.

As discussed above and further emphasized here, FIG. 8 is merely an example, which should not unduly limit the scope of the claims. One of ordinary skill in the art would recognize many variations, alternatives, and modifications. In one embodiment, the voltage 830 is used as a ramping signal, and the signal 820 is used as a clock signal. For example, the ramping signal and the clock signal are received by a PWM generator. The PWM generator uses the ramping signal to provide slope compensation. For example, the slope compensation ratio is constant regardless of the input voltage 850. Additionally, the PWM generator uses the clock signal to control switching frequency.

In another embodiment, the system 700 is used as the system 200. For example, the voltage 830 is the ramping signal 244, and the signal 820 is the clock signal 242. In another example, the frequency variation generator 710 is the frequency variation generator 210. In yet another example, the compensator 720 is the compensator 220. In yet another example, the control voltage 810 is the load signal 234. In yet another example, the input voltage 850 is the input voltage 224. In yet another embodiment, the system 200 or 700 is a part of the power converter.

In yet another embodiment, a method for providing frequency control to a power converter includes receiving a load signal. The load signal indicates an output load for a power converter. Additionally, the method includes generating a control signal in response to the load signal, processing information associated with the control signal, and generating an output signal based on at least information associated with the control signal. The output signal is associated with a signal strength and a frequency. The frequency is inversely proportional to a sum of a first time period, a second time period, and a third time period. The signal strength increase with the time during the first time period, the signal strength decrease with the time during the second time period, and the signal strength is constant with respect to the time during the third time period. The third time period varies with the load signal if the load signal is within a predetermined range. For example, the method can be performed by the system 200 and/or the system 700.

In yet another embodiment, a method for providing frequency control to a power converter includes receiving a load signal. The load signal indicates an output load for a power converter. Additionally, the method includes generating a first control signal in response to the load signal, receiving an input signal for the power converter, generating a second control signal in response to the input signal, processing information associated with the first control signal and the second control signal, and generating an output signal based on at least information associated with the first control signal and the second control signal. The output signal is associated with a signal strength and a frequency. The frequency is inversely proportional to a sum of a first time period, a second time period, and a third time period. The signal strength increases with the time at a first slope during the first time period, the signal strength decreases with the time at a second slope during the second time period, and the signal strength is constant with respect to the time during the third time period. The first slope varies with the input signal within a signal range, and the second slope varies with the input signal within the signal range. For example, the method can be performed by the system 200 and/or the system 700.

The present invention has various advantages. Some embodiments of the present invention provide an adaptive signal generator. The signal frequency is controlled by at least a control signal generated by a frequency variation generator and another control signal that represents the output loading. For example, the frequency variation generator outputs a randomized signal. In another example, the control signal for output loading includes a feedback voltage. Certain embodiments of the present invention provide an efficient control over switching frequency with low standby power. Some embodiments of the present invention improve stability of the power converter.

Certain embodiments of the present invention use dead-time modulation for adaptive frequency control. Some embodiments of the present invention provide an output waveform that includes three phases. In one embodiment, the three phases include a charging phase, a discharging phase, and a dead-time phase. For example, a dead-time phase is inserted between a discharging phase and a charging phase. In anther embodiment, the oscillator output frequency is adjusted by modulating the dead-time phase in response to various load conditions. For example, the dead-time phase is modulated by a voltage representing the output load for a switch-mode power converter. In yet another embodiment, the time period for the charging phase and the time period for the discharging phase are both independent of the load conditions. In yet another embodiment, the slope for signal strength during the charging phase and the discharging phase is independent of the load conditions. For example, the slope depends on the input voltage of the switch-mode power converter, but not the output load of the switch-mode power converter. Certain embodiments of the present invention provide dead-time modulation by charging a capacitor from an initial voltage level to a threshold voltage level with a constant current source. Some embodiments of the present invention provide a dead-time phase whose time period increases with the output load under light load or no load conditions. Some embodiments of the present invention provide a dead-time phase whose time period equal to zero under normal and heavy load conditions.

Certain embodiments of the present invention provide a signal generator. The signal slope is compensated for variations in input voltage, and used for slop compensation in a switch-mode power converter. For example, the power converter operates in the current mode. Some embodiments of the present invention sense the input voltage and adjust at least the charging and discharging currents accordingly. Certain embodiments of the present invention provide a ramping signal used for slope compensation. The ratio of slope compensation remains constant with respect to the input voltage. Some embodiments of the present invention improve stability of current feedback loop. Certain embodiments of the present invention use a clock randomizer for frequency modulation.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for providing frequency control to a power converter, the system comprising:
    a controller configured to receive a load signal and generate a first control signal, the load signal indicating an output load for a power converter; and
    a signal generator configured to receive the first control signal and generate at least a first output signal;
    wherein:
        the first output signal is associated with a first signal strength and a first frequency;
        the first frequency is inversely proportional to a sum of a first time period, a second time period, and a third time period;
        the first signal strength increases with the time during the first time period;
        the first signal strength decreases with the time during the second time period;
        the signal generator is further configured to generate a second output signal associated with a second signal strength and a second frequency;
        the second frequency is inversely proportional to a fourth time period and a fifth time period; and
        the second signal strength during the fourth time period is different from the second signal strength during the fifth time period.

2. The system of claim 1 wherein if the output load is less than a threshold load, the third time period increases with the decreasing output load.

3. The system of claim 1 wherein the third time period equals zero if the load signal is not within a predetermined range.

4. The system of claim 3 wherein if the output load is more than or equal to a threshold load, the third time period equals zero.

5. The system of claim 1 wherein the first time period is constant with respect to the load signal, and the second time period is constant with respect to the load signal.

6. The system of claim 1 wherein the first frequency is equal to the second frequency.

7. The system of claim 6 wherein the fourth period is equal to the first period, and the fifth period is equal to a sum of the second period and the third period.

8. The system of claim 6, and further comprising a pulse-width-modulation generator configured to receive at least the second output signal.

9. The system of claim 8 wherein the pulse-width-modulation generator uses the second signal to control a switching frequency for the power converter.

10. The system of claim 1 wherein the controller comprises a first capacitor associated with a first voltage;
    wherein:
        the load signal represents a load voltage level;
        the load voltage level is lower than a threshold voltage level; and
        during the third time period, the first voltage increases from the load voltage level to the threshold voltage level.

11. A system for providing frequency control to a power converter, the system comprising:
    a controller configured to receive a load signal and generate a first control signal, the load signal indicating an output load for a power converter;
    a signal generator configured to receive the first control signal and generate at least a first output signal; and
    a frequency variation generator configured to output a second control signal to the signal generator;
    wherein:
        the first output signal is associated with a first signal strength and a first frequency;
        the first frequency is inversely proportional to a sum of a first time period, a second time period, and a third time period;
        the first signal strength increases with the time during the first time period;
        the first signal strength decreases with the time during the second time period; and
        the signal generator is configured to use the second control signal to vary the first frequency.

12. The system of claim 11 wherein the frequency variation generator includes a clock randomizer.

13. The system of claim 11 wherein if the output load is less than a threshold load, the third time period increases with the decreasing output load.

14. The system of claim 11 wherein the third time period equals zero if the load signal is not within a predetermined range.

15. The system of claim 14 wherein if the output load is more than or equal to a threshold load, the third time period equals zero.

16. The system of claim 11 wherein the first time period is constant with respect to the load signal, and the second time period is constant with respect to the load signal.

17. The system of claim 11 wherein the controller comprises a first capacitor associated with a first voltage;
wherein:
the load signal represents a load voltage level;
the load voltage level is lower than a threshold voltage level; and
during the third time period, the first voltage increases from the load voltage level to the threshold voltage level.

18. A system for providing frequency control to a power converter, the system comprising:
a first controller configured to receive a load signal and generate a first control signal, the load signal indicating an output load for a power converter;
a compensation system configured to receive an input signal for the power converter and generate a second control signal; and
a signal generator configured to receive the first control signal and the second control signal and generates at least an output signal;
wherein:
the output signal is associated with a signal strength and a frequency;
the frequency is inversely proportional to a sum of a first time period, a second time period, and a third time period;
the signal strength increases with the time at a first slope during the first time period; and
the signal strength decreases with the time at a second slope during the second time period;
wherein the compensation system comprises:
a sensing system configured to receive the input signal and generate a third control signal; and
a compensation controller configured to receive the third control signal and output the second control signal.

19. The system of claim 18 wherein the first slope is constant with respect to the load signal, and the second slope is constant with respect to the load signal.

20. The system of claim 18 wherein the first time period is constant with respect to the input signal.

21. The system of claim 20 wherein the first time period is constant with respect to the load signal.

22. The system of claim 18 wherein the second time period is constant with respect to the input signal.

23. The system of claim 22 wherein the second time period is constant with respect to the load signal.

24. The system of claim 18 wherein the third time period varies with the load signal if the load signal is within a predetermined range.

25. The system of claim 24 wherein if the output load is less than a threshold load, the third time period increases with the decreasing output load.

26. The system of claim 25 wherein the third time period equals zero if the load signal is not within a predetermined range.

27. The system of claim 18, and further comprising a pulse-width-modulation generator configured to receive at least the output signal.

28. The system of claim 27 wherein the pulse-width-modulation generator is configured to use the output signal to perform a slope compensation for a feedback loop.

29. The system of claim 28 wherein the slope compensation is associated with a slope compensation ratio, the slope compensation ratio being constant with respect to the input signal.

30. The system of claim 18 wherein the first control signal comprises a plurality of signals.

31. A method for providing frequency control to a power converter, the method comprising:
receiving a load signal, the load signal indicating an output load for a power converter;
generating a control signal in response to the load signal;
processing information associated with the control signal;
generating a first output signal based on at least information associated with the control signal; and
generating a second output signal associated with a second signal strength and a second frequency;
wherein:
the first output signal is associated with a first signal strength and a first frequency;
the first frequency is inversely proportional to a sum of a first time period, a second time period, and a third time period;
the first signal strength increase with the time during the first time period;
the first signal strength decrease with the time during the second time period;
the second frequency is inversely proportional to a fourth time period and a fifth time period; and
the second signal strength during the fourth time period is different from the second signal strength during the fifth time period.

32. The method of claim 31 wherein the third time period equals zero if the load signal is not within a predetermined range.

33. A method for providing frequency control to a power converter, the method comprising:
receiving a load signal, the load signal indicating an output load for a power converter;
generating a first control signal in response to the load signal;
receiving an input signal for the power converter;
generating a second control signal in response to the input signal;
processing information associated with the first control signal and the second control signal; and
generating an output signal based on at least information associated with the first control signal and the second control signal;
wherein:
the output signal is associated with a signal strength and a frequency;
the frequency is inversely proportional to a sum of a first time period, a second time period, and a third time period;
the signal strength increases with the time at a first slope during the first time period; and
the signal strength decreases with the time at a second slope during the second time period;
wherein the process for generating a second control signal in response to the input signal includes:
generating a third control signal based on at least information associated with the input signal;
receiving the third control signal; and outputting the second control signal in response to the third control signal.

34. The method of claim 33, and further comprising:
performing a slope compensation for the power converter; wherein:
- the slope compensation is associated with a slope compensation ratio; and
- the slope compensation ratio is constant with respect to the input signal.

35. A method for providing frequency control to a power converter, the method comprising:
- receiving a load signal, the load signal indicating an output load for a power converter;
- generating a first control signal in response to the load signal;
- processing information associated with the first control signal;
- generating an output signal based on at least information associated with the first control signal, the output signal being associated with a signal strength and a frequency;
- receiving a second control signal; and
- using the second control signal to vary the frequency;

wherein:
- the frequency is inversely proportional to a sum of a first time period, a second time period, and a third time period;
- the signal strength increase with the time during the first time period; and
- the signal strength decrease with the time during the second time period.

* * * * *